(12) United States Patent
Wan et al.

(10) Patent No.: US 12,082,393 B2
(45) Date of Patent: Sep. 3, 2024

(54) METHOD FOR MANUFACTURING MEMORY AND MEMORY

(71) Applicant: CHANGXIN MEMORY TECHNOLOGIES, INC., Hefei (CN)

(72) Inventors: Qiang Wan, Hefei (CN); Jun Xia, Hefei (CN); Kangshu Zhan, Hefei (CN); Sen Li, Hefei (CN); Tao Liu, Hefei (CN); Penghui Xu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 492 days.

(21) Appl. No.: 17/457,819

(22) Filed: Dec. 6, 2021

(65) Prior Publication Data
US 2022/0254782 A1  Aug. 11, 2022

Related U.S. Application Data

(63) Continuation of application No. PCT/CN2021/112862, filed on Aug. 16, 2021.

(30) Foreign Application Priority Data

Feb. 5, 2021 (CN) .......................... 202110160895.5

(51) Int. Cl.
*H01L 27/108* (2006.01)
*H10B 12/00* (2023.01)

(52) U.S. Cl.
CPC ............ *H10B 12/03* (2023.02); *H10B 12/09* (2023.02); *H10B 12/30* (2023.02); *H10B 12/50* (2023.02)

(58) Field of Classification Search
None
See application file for complete search history.

(56) References Cited

U.S. PATENT DOCUMENTS

| 2012/0199944 A1* | 8/2012 | Huang .............. H01L 21/02244 257/532 |
| 2014/0065784 A1 | 3/2014 | Yoon et al. |
| 2014/0120683 A1 | 5/2014 | Kim et al. |

FOREIGN PATENT DOCUMENTS

| CN | 108538835 A | 9/2018 |
| CN | 209496851 U | 10/2019 |

(Continued)

OTHER PUBLICATIONS

International Search Report cited in PCT/CN2021/112862 mailed Oct. 28, 2021, 10 pages.

*Primary Examiner* — Asok K Sarkar
(74) *Attorney, Agent, or Firm* — Kilpatrick Townsend & Stockton LLP

(57) ABSTRACT

A method for manufacturing a memory and a memory is provided. The method for manufacturing a memory includes: providing a substrate; stacking an electrode support structure, a protective layer and a first mask layer in sequence on the substrate; patterning the first mask layer on an array region, and etching the protective layer, the electrode support structure and the substrate by using the patterned first mask layer as a mask, to form capacitor holes penetrating the protective layer and the electrode support structure and extending into the substrate; removing the first mask layer; and forming a first electrode layer on side walls and bottom walls of the capacitor holes, a top surface of the first electrode layer being flush with a top surface of the electrode support structure.

15 Claims, 14 Drawing Sheets

(56) References Cited

FOREIGN PATENT DOCUMENTS

| | | | |
|---|---|---|---|
| CN | 110504283 | A | 11/2019 |
| CN | 110504284 | A | 11/2019 |
| CN | 112786537 | A | 5/2021 |

* cited by examiner

METHOD FOR MANUFACTURING MEMORY AND MEMORY

CROSS-REFERENCE TO RELATED APPLICATIONS

This is a continuation of International Application No. PCT/CN2021/112862, filed on Aug. 16, 2021, which claims the priority to Chinese Patent Application 202110160895.5, titled "METHOD FOR MANUFACTURING MEMORY AND MEMORY" and filed on Feb. 5, 2021. The entire contents of International Application No. PCT/CN2021/112862 and Chinese Patent Application 202110160895.5 are incorporated herein by reference.

TECHNICAL FIELD

The disclosure relates to, but not limited to a method for manufacturing a memory and a memory.

BACKGROUND

With the continuous development of semiconductor technology and memory technology, electronic equipment continues to develop toward miniaturization and integration. Dynamic Random Access Memory (DRAM) is widely used in electronic equipment due to its relatively high storage density and relatively fast read and write speed.

The DRAM usually includes an array region and a peripheral circuit region arranged along the periphery of the array region. A plurality of capacitors is arranged in an array in the array region, and transistors for controlling the capacitors and contact lines electrically connected to the transistors are arranged in the peripheral circuit region.

However, during the manufacturing of a capacitor, the height of an electrode support structure of the capacitor is reduced, which in turn reduces the height of the capacitor and the storage performance of the capacitor.

SUMMARY

The first aspect of the embodiments of the disclosure provides a method for manufacturing a memory, including:
  providing a substrate, the substrate including an array region and a peripheral circuit region connected to the array region;
  stacking an electrode support structure, a protective layer and a first mask layer in sequence on the substrate;
  patterning first mask layer on the array region, and etching the protective layer, the electrode support structure and the substrate by using the patterned first mask layer as a mask, to form capacitor holes penetrating the protective layer and the electrode support structure and extending into the substrate;
  removing the first mask layer; and
  forming a first electrode layer on side walls and bottom walls of the capacitor holes, a top surface of the first electrode layer being flush with a top surface of the electrode support structure.

The second aspect of the embodiments of the disclosure provides a memory, including the memory formed by any of the above methods.

In addition to the technical problems solved by the embodiments of the disclosure, the technical features constituting the technical solutions, and the beneficial effects brought about by the technical features of these technical solutions as described above, other technical problems that can be solved by the method for manufacturing a memory and the method provided by the embodiments of the disclosure, other technical features included in the technical solutions, and the beneficial effects brought by these technical features will be further described in detail in specific implementations.

DETAILED DESCRIPTION

In the related technology, when a memory is manufactured, usually a mask layer is directly formed on an electrode support structure and patterned, then the patterned mask layer forms a plurality of capacitor holes spaced apart on the electrode support structure, and finally the mask layer is removed with an etching gas. When the mask layer is removed, part of the thickness of the electrode support structure is etched, resulting in reductions in the height of the capacitor holes, thereby reducing the height of a first electrode layer formed in the capacitor holes, and reducing the storage performance of the memory.

In view of the above technical problems, the embodiments of the disclosure provide a method for manufacturing a memory and a memory, in which a protective layer is arranged between the electrode support structure and the first mask layer, so that the electrode support structure will not be damaged when the first mask layer is removed subsequently, the height of the electrode support structure is ensured, then the contact areas between the first electrode layer subsequently formed and the side walls of each of the capacitor holes are ensured, and the storage performance of the memory is improved.

To make the above objectives, features, and advantages of the embodiments of the disclosure more obvious and understandable, the following clearly and completely describes the technical solutions in the embodiments of the disclosure with reference to the accompanying drawings in the embodiments of the disclosure. Apparently, the described embodiments are some but not all of the embodiments of the disclosure. All other embodiments obtained by those of ordinary skill in the art without any creative efforts based on the embodiments of the disclosure shall fall within the protection scope of the disclosure.

Figure 1:
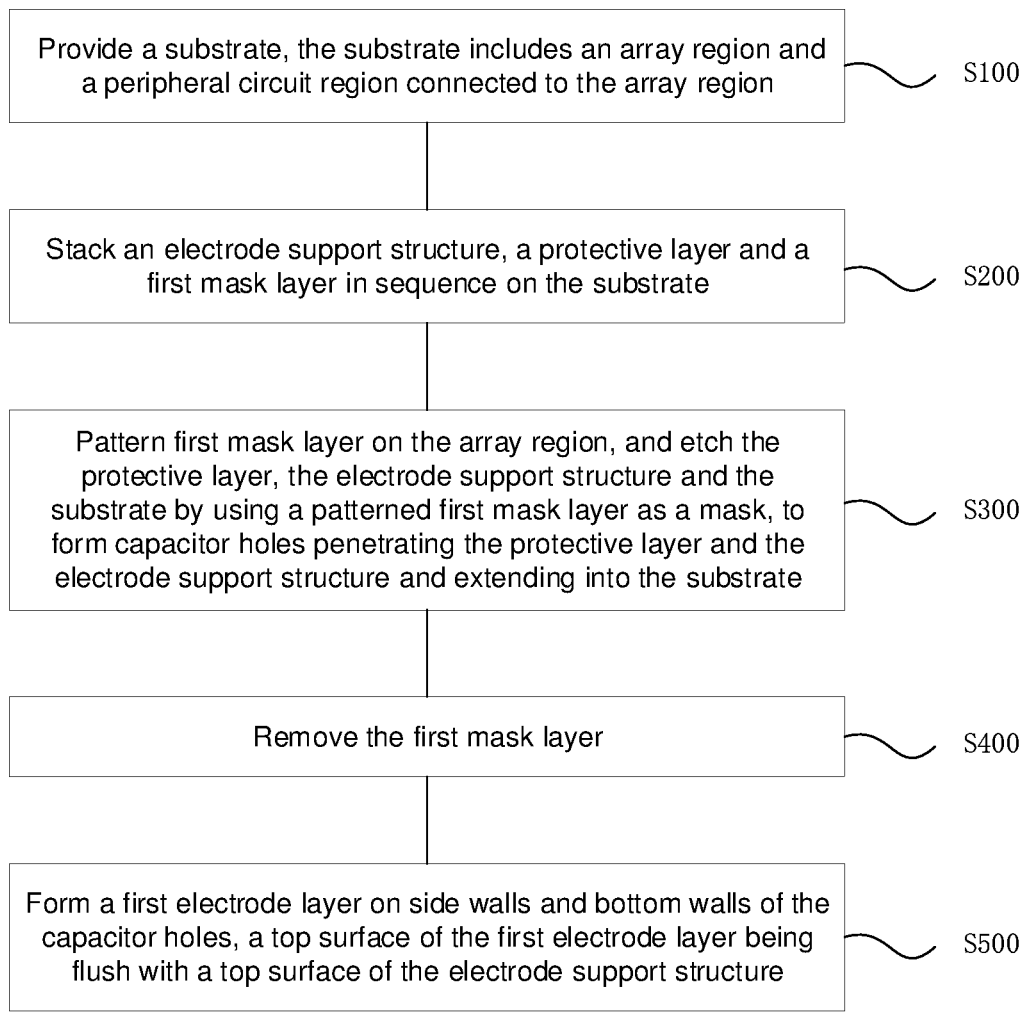
FIG. 1 is a flowchart of a method for manufacturing a memory provided by an embodiment of the disclosure.

FIG. 1 is a flowchart of a method for manufacturing a memory provided by an embodiment of the disclosure, and FIGS. 2 to 14 are schematic diagrams of various stages of the method for manufacturing a memory. The method for manufacturing a memory is described below with reference to FIGS. 1 to 14.

As shown in FIG. 1, an embodiment of the disclosure provides a method for manufacturing a memory, including the following steps:

Step S100: providing a substrate, the substrate including an array region and a peripheral circuit region connected to the array region.

Figure 2:
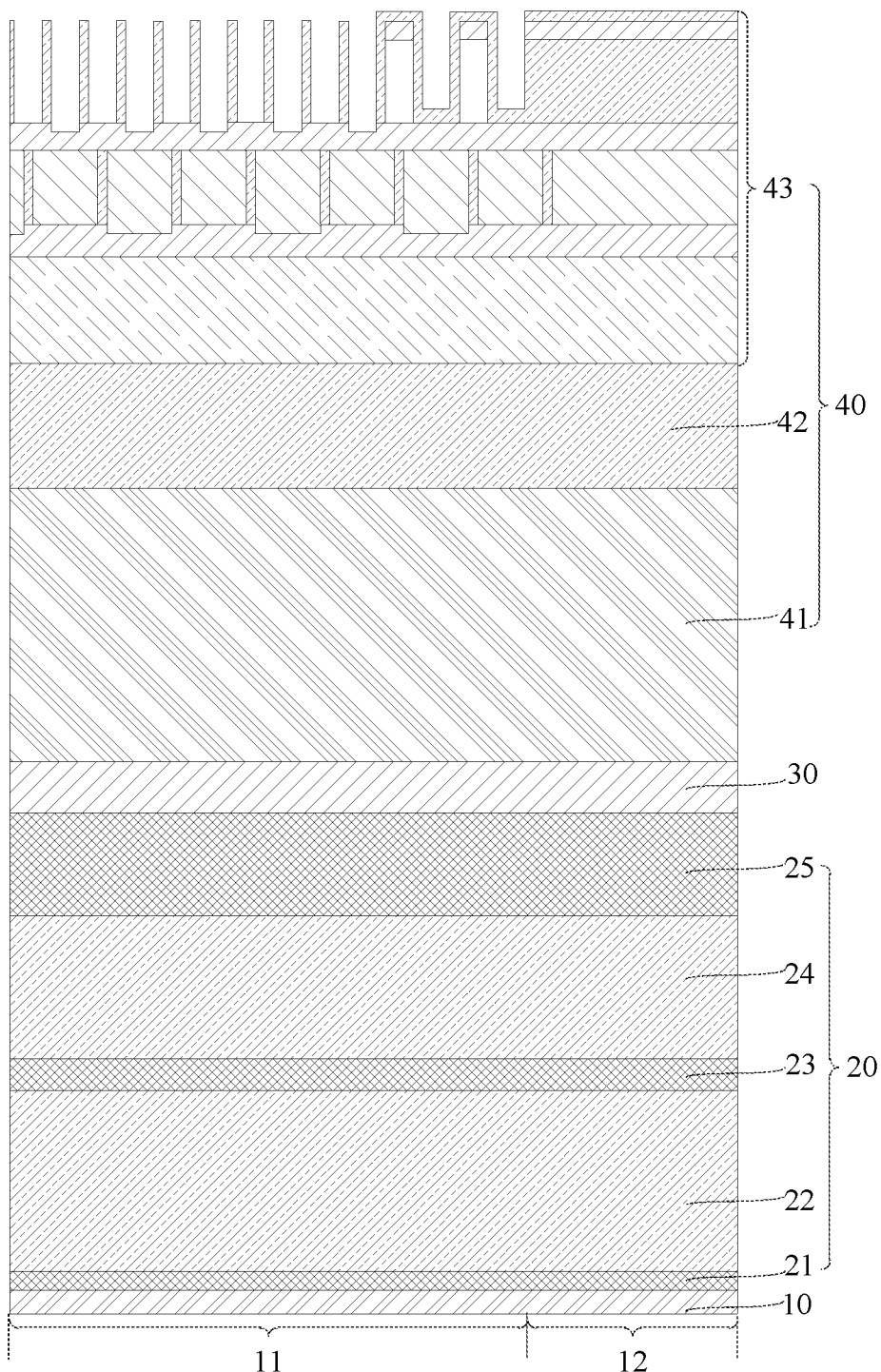
FIG. 2 is a schematic structure diagram of forming an electrode support structure, a protective layer and a patterned first mask layer in the method for manufacturing a memory provided by an embodiment of the disclosure.

Exemplarily, as shown in FIG. 2, the substrate 10 is used as a support component of the memory to support other components thereon. The substrate 10 may be made of a semiconductor material, and the semiconductor material may be one or more of silicon, germanium, a silicon-germanium compound and a silicon-carbon compound.

The substrate 10 may include an array region 11 and a peripheral circuit region 12 connected to the array region 11. Specifically, the peripheral circuit region 12 may be arranged on one side of the array region 11, and the peripheral circuit region 12 may also be arranged around the array region 11. The array region 11 is provided with memory cells, the peripheral circuit region 12 is provided with a metal wiring layer (not shown) connected to the memory cells, and the memory cells read, write and store data by means of the metal wiring layer.

Step S200: stacking an electrode support structure, a protective layer and a first mask layer in sequence on the substrate.

Continuing to refer to FIG. 2, the electrode support structure 20, the protective layer 30 and the first mask layer 40 are formed in sequence on the substrate 10 by atomic layer deposition or chemical vapor deposition.

In this embodiment, the electrode support structure 20 may be a laminated structure. For example, the electrode support structure 20 may include a first support layer 21, a first sacrificial layer 22, a second support layer 23, a second sacrificial layer 24 and a third support layer 25. The first support layer 21, the first sacrificial layer 22, the second support layer 23, the second sacrificial layer 24 and the third support layer 25 are laminated in sequence on the substrate 10 by atomic layer deposition or chemical vapor deposition, wherein the first support layer 21 is arranged on the substrate 10.

The protective layer 30 is formed on the third support layer 25. Specifically, the protective layer 30 with a certain thickness may be formed on the third support layer 25 by atomic layer deposition or chemical vapor deposition. The protective layer 30 protects the third support layer 25 to prevent damage to the third support layer 25 in the subsequent manufacturing process. The material of the protective layer 30 may include an oxide or the like, such as silicon oxide.

The thickness of the protective layer 30 may be 50 nm to 100 nm. A too thick or too thin protective layer 30 should be avoided.

If the protective layer 30 is too thick, the cost of manufacturing the protective layer 30 will be increased; if the protective layer 30 is too thin, the protective layer 30 is easily etched through during subsequent etching of the first mask layer 40 to damage the electrode support structure 20, and cannot protect the electrode support structure 20; therefore, the thickness of the protective layer 30 is limited in this embodiment to protect the electrode support structure 20 and reduce the production cost of the protective layer 30.

The first mask layer 40 is formed on the protective layer 30. The first mask layer 40 may include a polysilicon layer 41, an oxide layer 42 and a first hard mask layer 43 sequentially stacked on the protective layer 30. The first hard mask layer 43 may be of a single-layer structure or a stacked-layer structure.

In this embodiment, the thickness of the polysilicon layer 41 is 5 to 7 times the thickness of the protective layer 30, so that the protective layer 30 can be protected from being over-etched when the polysilicon layer 41 is etched.

Step S300: patterning the first mask layer on the array region, and etching the protective layer, the electrode support structure and the substrate by using the patterned first mask layer as a mask, to form capacitor holes penetrating the protective layer and the electrode support structure and extending into the substrate.

In this embodiment, the first mask layer 40 may be patterned by dry etching, wherein the etching gas for the dry etching is one of HBr, $NF_3$ and $O_2$, and the dry etching temperature is between 30° C. and 90° C. The etching precision of the first mask layer 40 can be improved by limiting the etching gas and etching temperature of the dry etching.

Specifically, the first hard mask layer 43 on the array region 11 is patterned to form a pattern on the first hard mask layer 43.

As shown in FIG. 2, after the first hard mask layer 43 on the array region 11 is patterned, the oxide layer 42 and the polysilicon layer 41 are etched using the patterned first hard mask layer 43 as a mask, to form a patterned oxide layer 42 and a patterned polysilicon layer 41.

Figure 3:
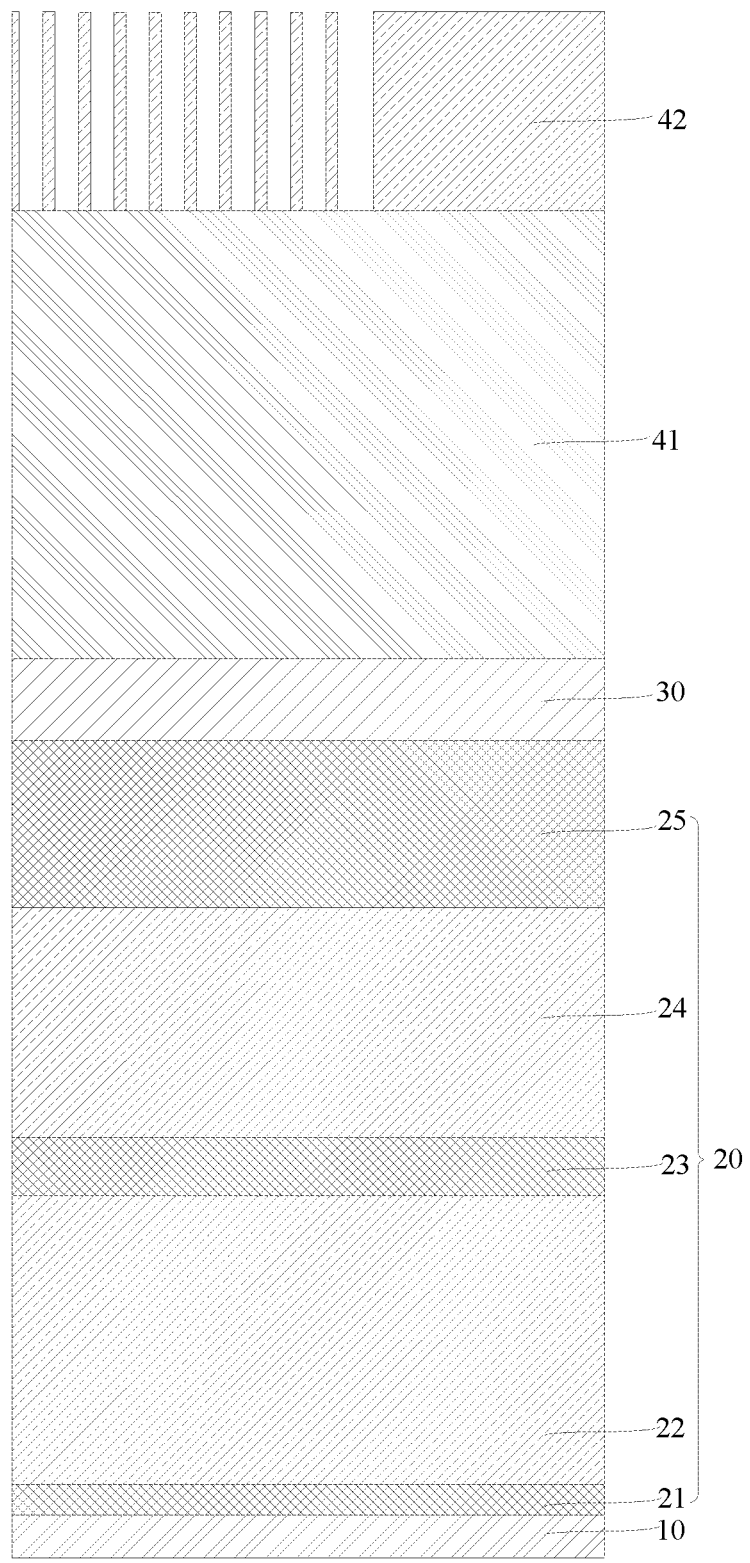
FIG. 3 is a schematic structure diagram of a patterned oxide layer in the method for manufacturing a memory provided by an embodiment of the disclosure.

Illustratively, the oxide layer 42 is etched using the patterned first hard mask layer 43 as a mask, to transfer the pattern on the first hard mask layer 43 to the oxide layer 42, so as to form a structure as shown in FIG. 3.

Figure 4:
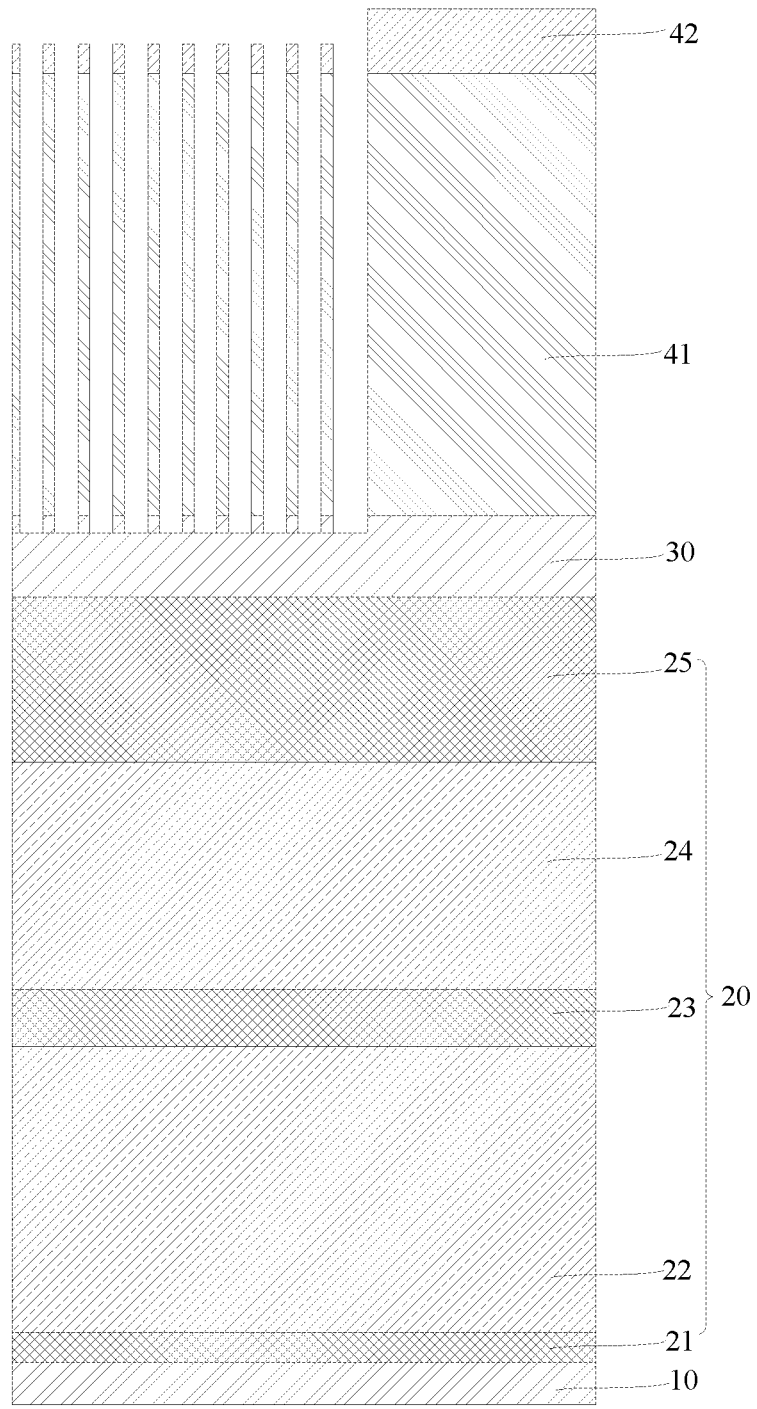
FIG. 4 is a schematic structure diagram of a patterned polysilicon layer in the method for manufacturing a memory provided by an embodiment of the disclosure.

After the patterned oxide layer 42 is formed, the polysilicon layer 41 is continuously etched using the patterned oxide layer 42 as a mask, to transfer the pattern on the oxide layer 42 to the polysilicon layer 41, so as to form a structure as shown in FIG. 4.

Figure 5:
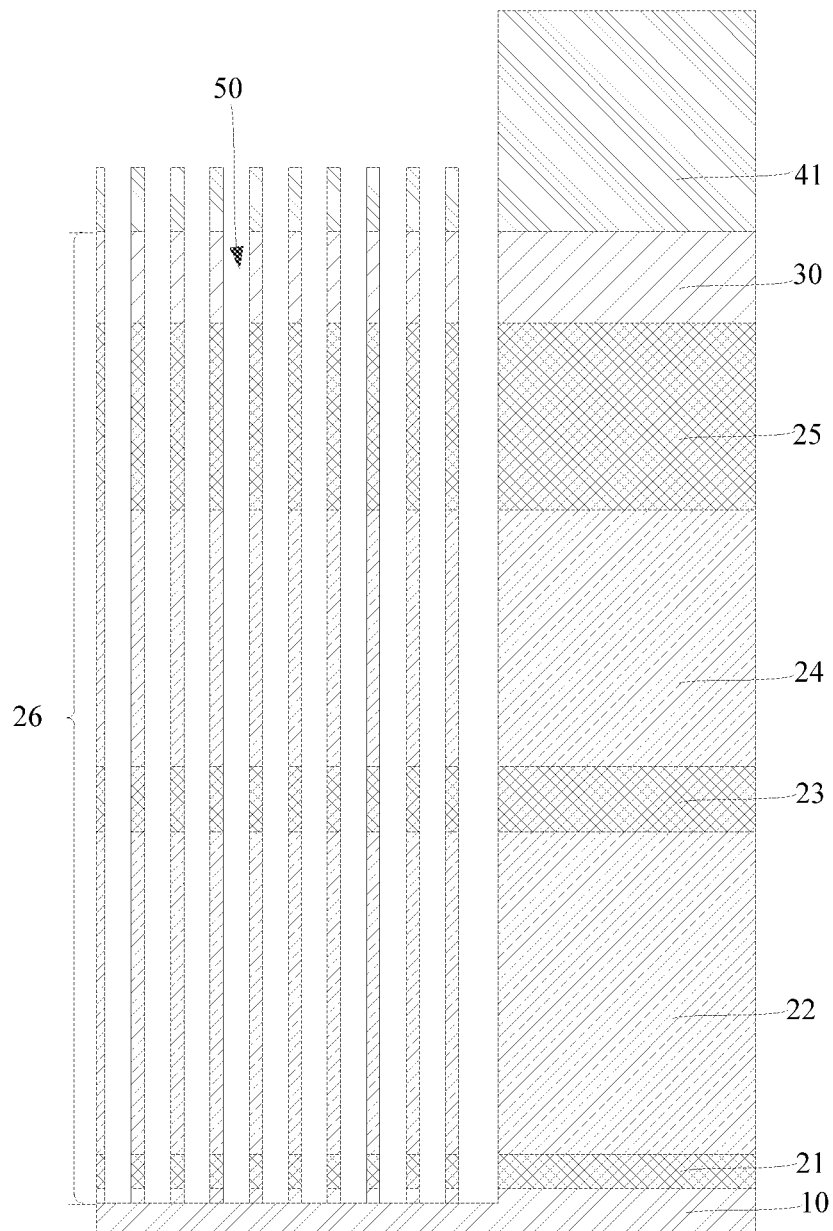
FIG. 5 is a schematic structure diagram of forming capacitor holes in the method for manufacturing a memory provided by an embodiment of the disclosure.

After the patterned polysilicon layer 41 is formed, the protective layer 30, the electrode support structure 20 and part of the substrate 10 are etched using the patterned polysilicon layer 41 as a mask, to form the capacitor holes 50 penetrating the protective layer 30 and the electrode support structure 20 and extending into the substrate 10, as shown in FIG. 5.

Specifically, the protective layer 30, the third support layer 25, the second sacrificial layer 24, the second support layer 23, the first sacrificial layer 22, the first support layer 21 and part of the substrate 10 are etched using the patterned oxide layer 42 and the patterned polysilicon layer 41 as masks, to form a plurality of capacitor holes 50 spaced apart on the array region 11, and the portion of the electrode support structure 20 excluding the capacitor holes 50 constitutes electrode support portions 26.

In this embodiment, the patterned polysilicon layer 41 may be understood as the polysilicon layer 41 on the array region 11 may include a plurality of shielding regions spaced apart, and opening regions are formed between adjacent shielding regions.

The protective layer 30, the electrode support structure 20 and part of the substrate 10 exposed in the opening region may be removed with an etching gas to form the capacitor holes 50 penetrating the protective layer 30 and the electrode support structure 20 and extending into the substrate 10.

Figure 6:
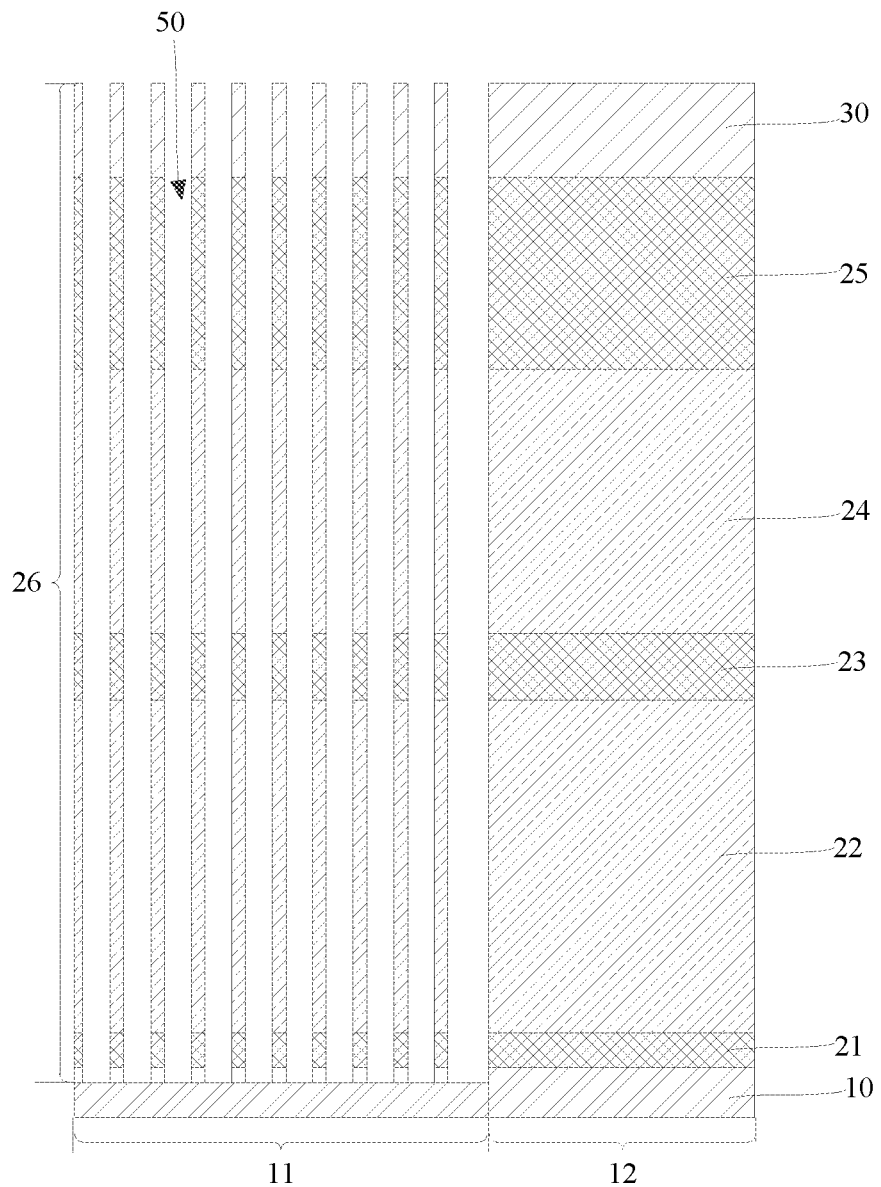
FIG. 6 is a schematic structure diagram after removing the first mask layer in the method for manufacturing a memory provided by an embodiment of the disclosure.

Step S400: removing the first mask layer, that is, removing the polysilicon layer, as shown in FIG. 6.

In this embodiment, the first mask layer may be removed by wet etching, that is, the polysilicon layer 41 may be removed by wet etching, wherein the etching solution used in the wet etching is a mixed solution of $NH_4F$ and HF.

Figure 7:
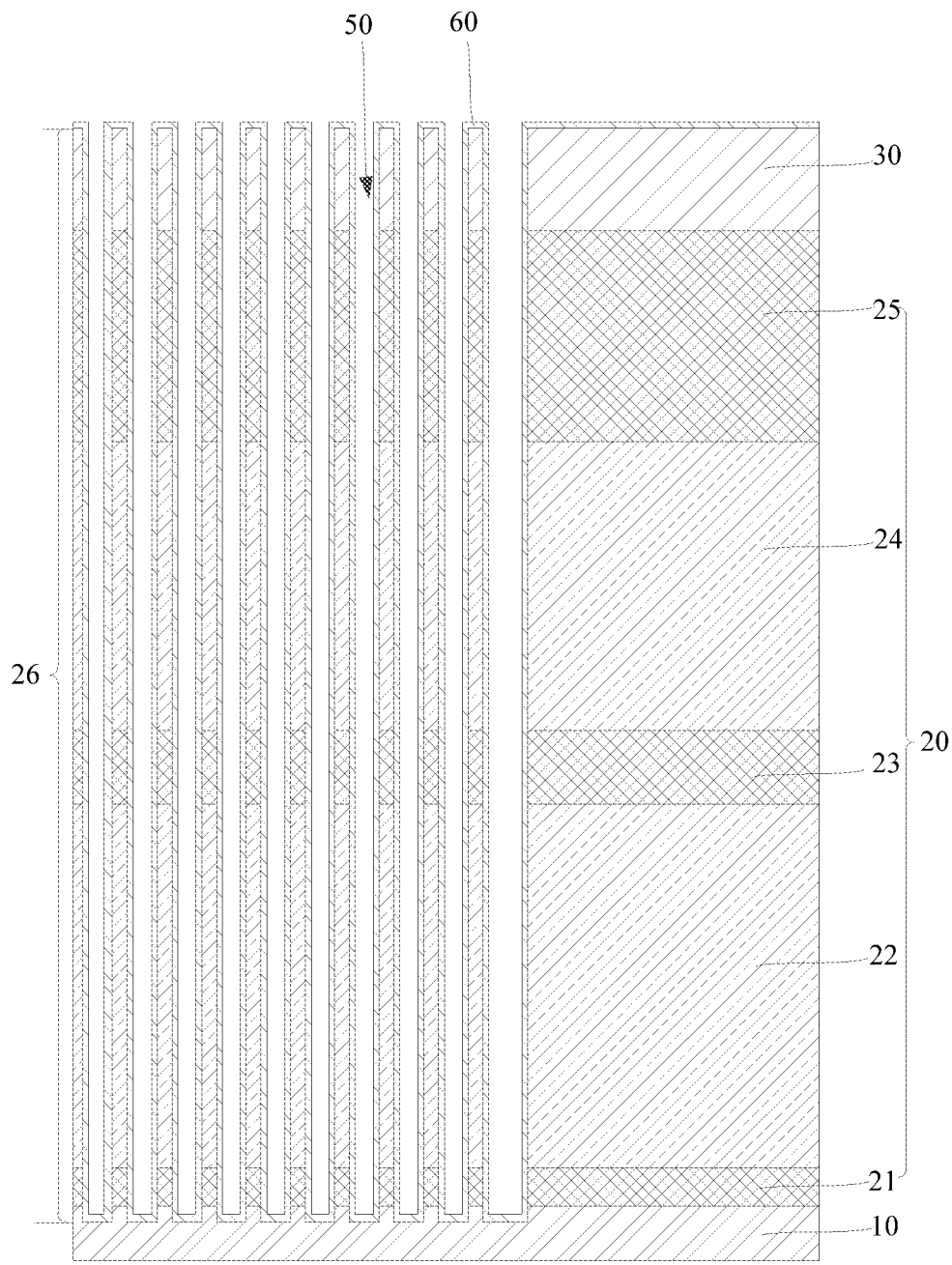
FIG. 7 is a schematic structure diagram of forming a conductive layer in the method for manufacturing a memory provided by an embodiment of the disclosure.
Figure 8:
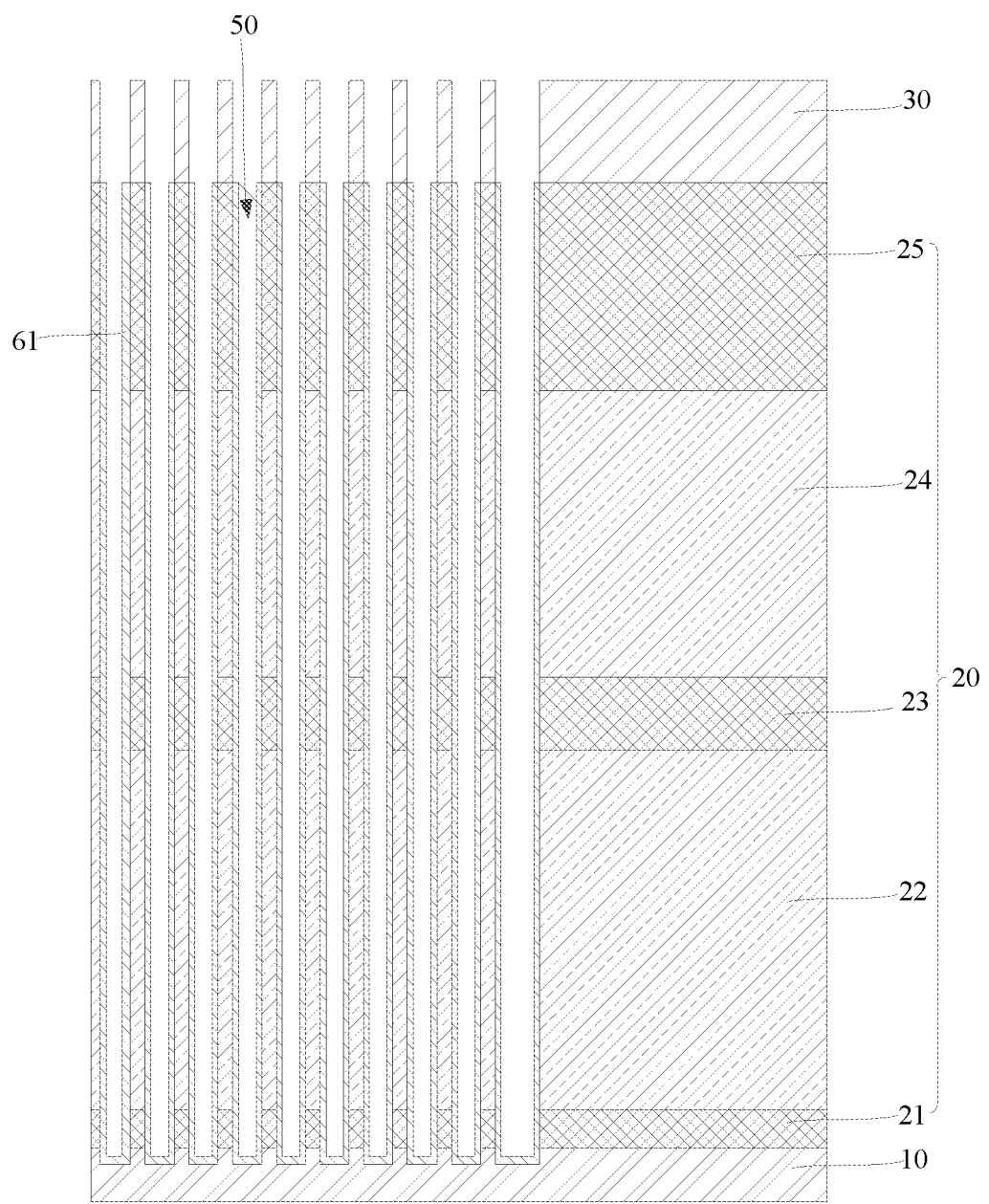
FIG. 8 is a schematic structure diagram of forming a first electrode layer in the method for manufacturing a memory provided by an embodiment of the disclosure.

Step S500: forming a first electrode layer on side walls and bottom walls of the capacitor holes, a top surface of the first electrode layer being flush with a top surface of the electrode support structure, as shown in FIGS. 7 and 8.

A conductive layer 60 is formed on the side walls and the bottom walls of the capacitor holes. Specifically, the conductive layer 60 may be formed on the side walls and the bottom walls of the capacitor holes 50 and on the top surface of the protective layer 30 by atomic layer deposition.

Then the conductive layer 60 on the top surface of the protective layer 30 and part of the conductive layer 60 on the side walls of the capacitor holes 50 are removed by an etching solution or etching gas, and the conductive layer 60 remaining on the side walls and the bottom walls of the capacitor holes 50 constitutes the first electrode layer 61.

Figure 9:
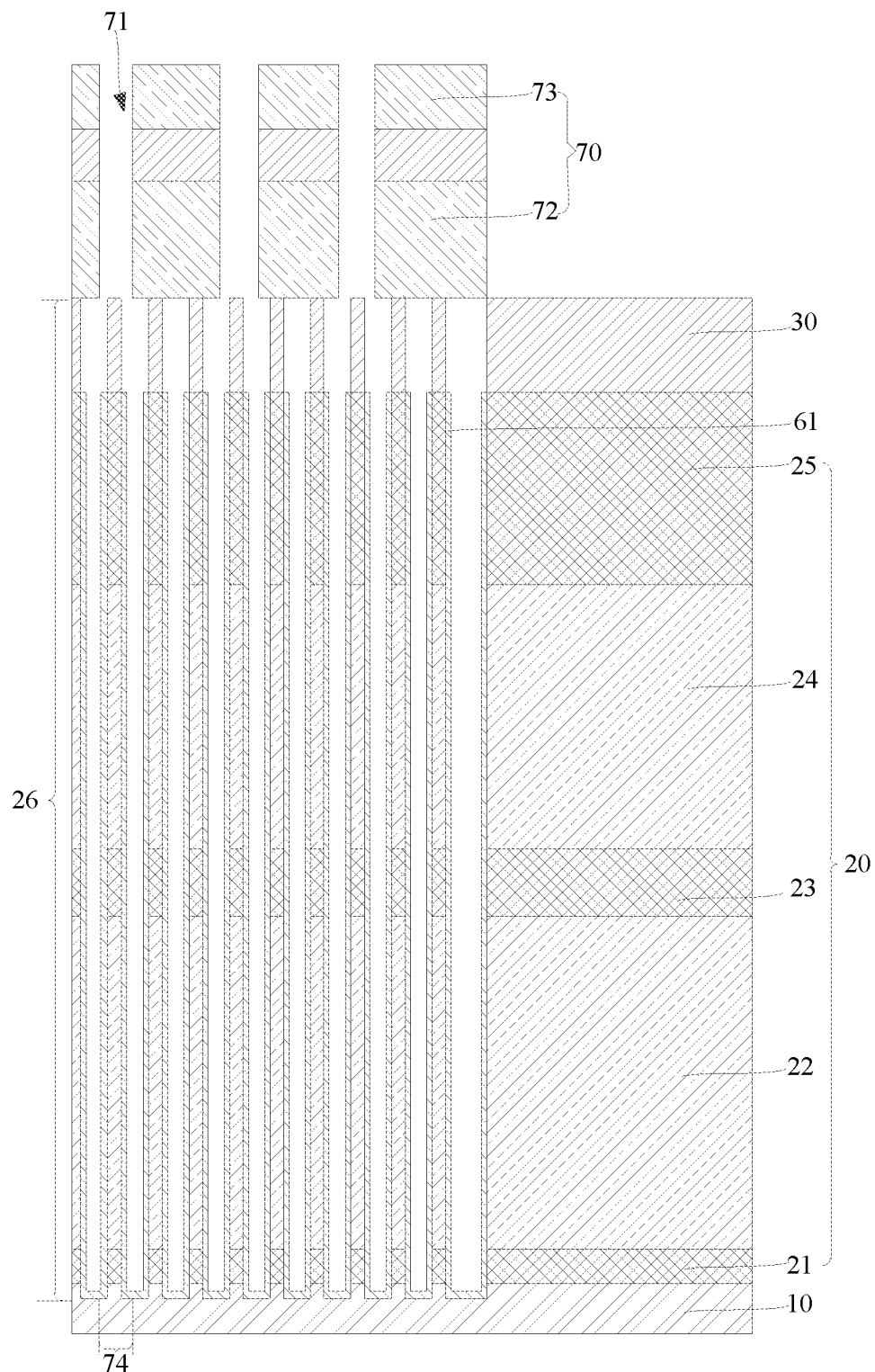
FIG. 9 is a schematic structure diagram of forming a second mask layer in the method for manufacturing a memory provided by an embodiment of the disclosure.

In some embodiments, in order to ensure the performance of the memory, the protective layer 30, the first sacrificial layer 22 and the second sacrificial layer 24 need to be removed. The specific process steps are as follows:

A second mask layer 70 is formed on the protective layer 30 above the array region 11, as shown in FIG. 9.

Exemplarily, the second mask layer 70 is formed on the protective layer 30 above the array region 11. For example, a second mask layer 70 may be formed on the protective layer 30 above the array region 11 by deposition, then the second mask layer 70 is patterned to form a plurality of first openings 71 spaced apart in the second mask layer 70, and each first opening 71 exposes at least one electrode support portion 26, that is, each first opening 71 can expose the electrode support portion 26 between two adjacent capacitor holes 50.

The first opening 71 has a preset projection region 74 on the substrate 10, that is, the projection of the first opening 71 on the substrate 10 is the preset projection region 74.

In this embodiment, the second mask layer 70 may be of a laminated structure. For example, the second mask layer 70 includes a second hard mask layer 72 and a photoresist layer 73 laminated, and the second hard mask layer 72 is arranged on the protective layer 30.

Specifically, the photoresist layer 73 may be patterned by exposure, development or etching to form a plurality of openings spaced apart on the photoresist layer 73, and then the second hard mask layer 72 exposed in each of the openings is etched with an etching solution or etching gas to form a first opening 71 in the second mask layer 70.

Figure 10:
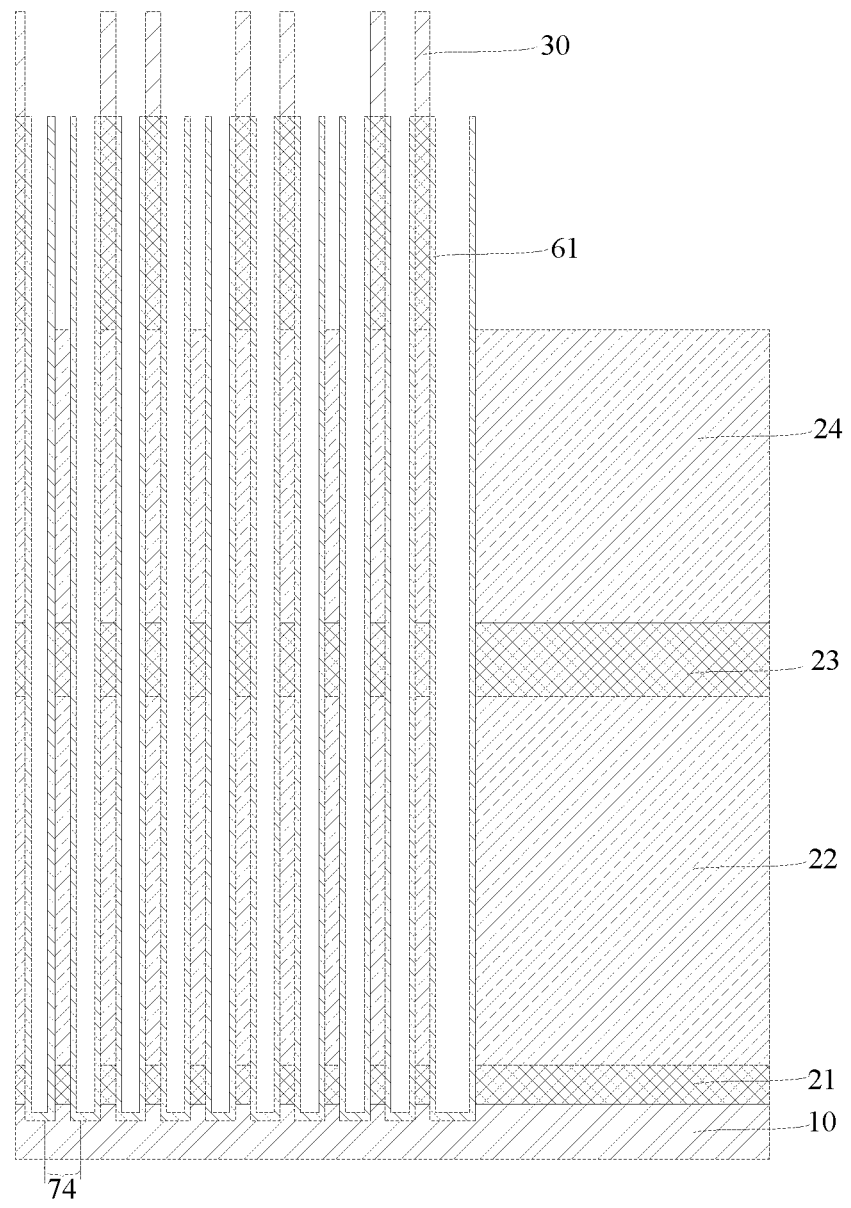
FIG. 10 is a schematic structure diagram of removing a third support layer exposed in a first opening and the protective layer and the third support layer on the peripheral circuit region in the method for manufacturing the memory provided by an embodiment of disclosure.

After the first opening 71 is formed, the third support layer 25 in the electrode support portion 26 that is exposed in the first opening 71 may be removed by dry etching or wet etching to expose the second sacrificial layer 24; and the protective layer 30 and the third support layer 25 on the peripheral circuit region 12 are removed, as shown in FIG. 10.

The above statement may also be understood as, after the first opening 71 is formed, the third support layer 25 in the preset projection region 74 may be removed by dry etching or wet etching to expose the second sacrificial layer 24, and the protective layer 30 and the third support layer 25 on the peripheral circuit region 12 are removed.

After the above process is completed, the second mask layer 70 is removed by dry etching, wherein the gas for dry etching includes at least one of $Cl_2$, $SO_2$, $C_4F_6$, $CH_2F_2$, $O_2$, $CF_4$, $CHF_3$ and $SF_6$.

Figure 11:
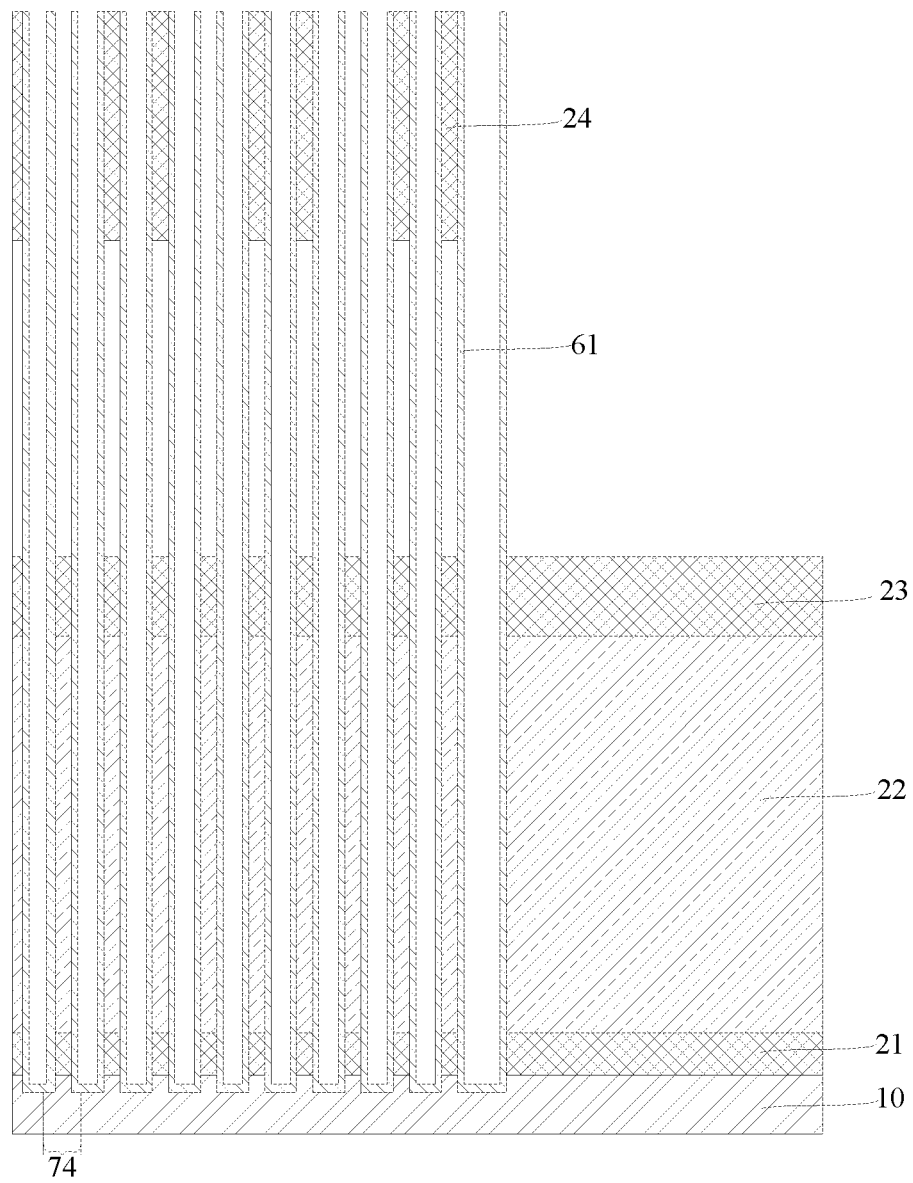
FIG. 11 is a schematic structure diagram of removing the protective layer and a second sacrificial layer on the array region in the method for manufacturing a memory provided by an embodiment of the disclosure.

After the second mask layer 70 is removed, the protective layer 30 on the array region 11 and the second sacrificial layer 24 on the array region 11 and the peripheral circuit region 12 may be removed by wet etching, as shown in FIG. 11.

In this embodiment, the protective layer 30 on the array region 11 and the second sacrificial layer 24 on the array region 11 and the peripheral circuit region 12 may be removed using an etching solution with a high selection ratio, so that the protective layer 30 can be removed while the second sacrificial layer 24 is removed, and a separate process is not required to remove the protective layer 30, which simplifies the etching process and saves the production cost. The etching solution may include a mixed solution of $NH_4F$ and HF.

Figure 12:
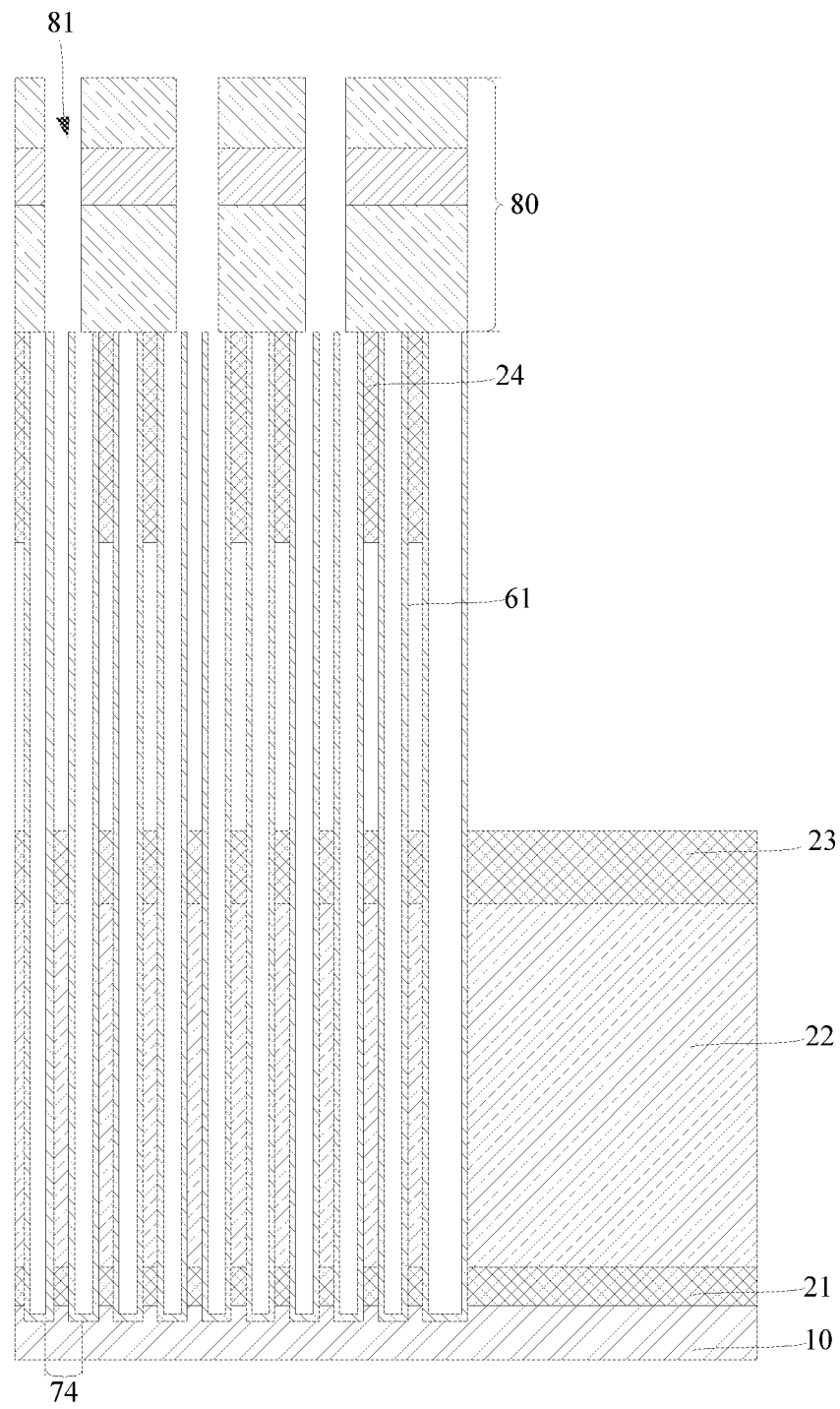
FIG. 12 is a schematic structure diagram of forming a third mask layer in the method for manufacturing a memory provided by an embodiment of the disclosure.

As shown in FIG. 12, a third mask layer 80 is formed on the third support layer 25 on the array region 11, that is, a third mask layer 80 is formed on the third support layer 25 on the array region 11 by deposition.

The third mask layer 80 is patterned to form a plurality of second openings 81 spaced apart in the third mask layer 80. The projection region of the second opening 81 on the substrate 10 coincides with the preset projection region 74.

In this embodiment, the third mask layer 80 may be of a laminated structure. For example, the structure of the third mask layer 80 is the same as the structure of the second mask layer 70, and also includes a second hard mask layer and a photoresist layer laminated, and the second hard mask layer is arranged on the third support layer 25.

Specifically, the photoresist layer may be patterned by exposure, development or etching to form a plurality of openings spaced apart on the photoresist layer, and then the second hard mask layer exposed in each of the openings is etched with an etching solution or etching gas to form a second opening 81 in the third mask layer 80.

Figure 13:
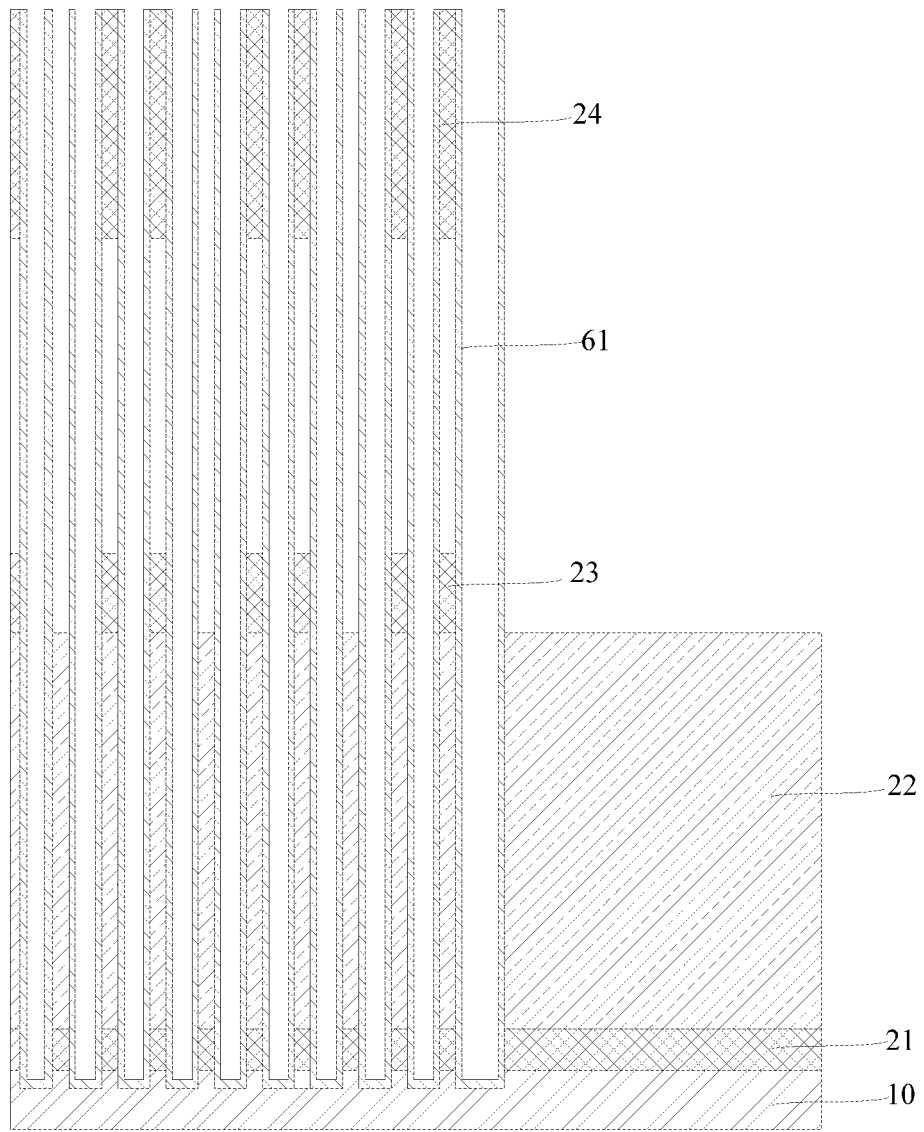
FIG. 13 is a schematic structure diagram of removing a second support layer in a second opening and on the peripheral circuit region in the method for manufacturing a memory provided by an embodiment of the disclosure.

After the second opening 81 is formed, the second support layer 23 in the electrode support portion that is exposed in the second opening 81 may be removed by dry etching or wet etching to expose the first sacrificial layer 22; and the second support layer 23 on the peripheral circuit region 12 is removed, as shown in FIG. 13.

The above statement may also be understood as, the second support layer 23 exposed in the preset projection region 74 is removed by dry etching or wet etching to expose the first sacrificial layer 22; and the second support layer 23 on the peripheral circuit region 12 is removed. In this embodiment, the projection region of the second opening 81 on the substrate 10 coincides with the preset projection region 74, which can ensure that the third support layer 25 and the second support layer 23 that are etched away belong to the same electrode support portion.

After the first sacrificial layer 22 and part of the second support layer 23 are removed, the third mask layer 80 may be removed by dry etching, which can prevent the third mask layer 80 from affecting the subsequent removal of the first sacrificial layer 22, wherein the gas for dry etching includes at least one of $Cl_2$, $SO_2$, $C_4F_6$, $CH_2F_2$, $O_2$, $CF_4$, $CHF_3$ and $SF_6$.

Figure 14:
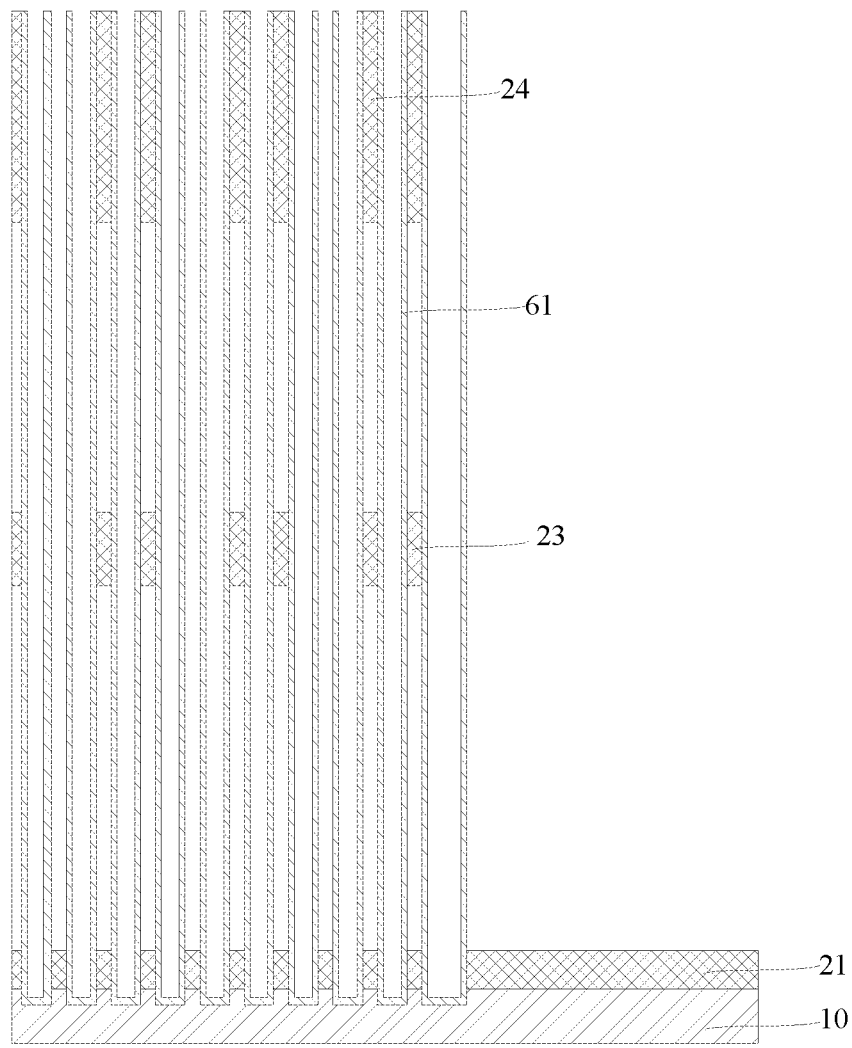
FIG. 14 is a schematic structure diagram of removing a first sacrificial layer in the method for manufacturing a memory provided by an embodiment of the disclosure.

After the third mask layer 80 is removed, the first sacrificial layer 22 may be removed by wet etching to form a structure as shown in FIG. 14. Specifically, the first sacrificial layer 22 is etched with an etching solution with a high etching ratio, and ultimately uniform capacitor holes 50 with the first electrode layer 61 are formed on the array region 11.

Finally, a dielectric layer (not shown) and a second electrode layer (not shown) are sequentially formed on the first electrode layer 61 to form a plurality of capacitors in the array region 11.

This embodiment provides a method for manufacturing a memory, in which a protective layer is arranged between the electrode support structure and the first mask layer, so that the electrode support structure will not be damaged when the first mask layer is removed subsequently, the height of the electrode support structure is ensured, then the contact area between the first electrode layer subsequently formed and the side walls of the capacitor holes is ensured, and the storage performance of the memory is improved.

An embodiment of the disclosure further provides a memory, which is formed by the method in the foregoing embodiment.

In this embodiment, when the memory is formed, a protective layer is arranged between the electrode support structure and the first mask layer, and the protective layer can prevent damage to the third support layer, which ensures the height of the electrode support structure, thereby ensuring the contact area between the first electrode layer subsequently formed and the side walls of the capacitor holes and improving the storage performance of the memory.

The embodiments or implementations in this specification are described in a progressive manner, each embodiment focuses on the differences from other embodiments, and the same or similar parts between the various embodiments may be referred to each other.

In the description of this specification, the descriptions with reference to the terms "one embodiment", "some embodiments", "exemplary embodiment", "example", "specific example", or "some examples", etc. mean that specific features, structures, materials or characteristics described in conjunction with the embodiments or examples are included in at least one embodiment or example of the disclosure.

In this specification, the schematic descriptions of the above terms do not necessarily refer to the same embodiment or example. Moreover, the described specific features, structures, materials or characteristics may be combined in an appropriate manner in any one or more embodiments or examples.

Finally, it should be noted that the above embodiments are merely intended to describe, but not to limit, the technical solutions of the disclosure. Although the disclosure is described in detail with reference to the above embodiments, those of ordinary skill in the art should understand that various modifications may be made to the technical solutions described in the foregoing embodiments or equivalent substitutions may be made to some or all technical features thereof, and these modifications or substitutions do not make the essences of the corresponding technical solutions depart from the scope of the technical solutions of the embodiments of the disclosure.

The invention claimed is:

1. A method for manufacturing a memory, comprising:
providing a substrate, the substrate comprising an array region and a peripheral circuit region connected to the array region;
stacking an electrode support structure, a protective layer and a first mask layer in sequence on the substrate;
patterning first mask layer on the array region, and etching the protective layer, the electrode support structure and the substrate by using the patterned first mask layer as a mask, to form capacitor holes penetrating the protective layer and the electrode support structure and extending into the substrate;
removing the first mask layer; and
forming a first electrode layer on side walls and bottom walls of the capacitor holes, a top surface of the first electrode layer being flush with a top surface of the electrode support structure.

2. The method for manufacturing the memory according to claim 1, wherein in the stacking the electrode support structure, the protective layer and the first mask layer in sequence on the substrate, the first mask layer comprises a polysilicon layer, an oxide layer and a first hard mask layer sequentially stacked on the protective layer, and a thickness of the polysilicon layer is 5 to 7 times a thickness of the protective layer.

3. The method for manufacturing the memory according to claim 2, wherein the protective layer has the thickness of 50 nm to 110 nm, and a material of the protective layer is silicon oxide.

4. The method for manufacturing the memory according to claim 3, wherein in the stacking the electrode support structure, the protective layer and the first mask layer in sequence on the substrate, the electrode support structure comprises a first support layer, a first sacrificial layer, a second support layer, a second sacrificial layer and a third support layer sequentially stacked on the substrate.

5. The method for manufacturing the memory according to claim 4, wherein the patterning the first mask layer on the array region comprises:
patterning first hard mask layer on the array region, and etching the oxide layer and the polysilicon layer by using a patterned first hard mask layer as a mask, to form a patterned oxide layer and a patterned polysilicon layer; and
etching the protective layer, the third support layer, the second sacrificial layer, the second support layer, the first sacrificial layer, the first support layer and the substrate by using the patterned oxide layer and the patterned polysilicon layer as masks, to form a plurality of electrode support portions spaced apart on the array region, the adjacent electrode support portions constituting the capacitor holes.

6. The method for manufacturing the memory according to claim 5, wherein the removing the first mask layer comprises:

removing the polysilicon layer by dry etching, an etching gas for the dry etching being one of HBr, NF$_3$ and O$_2$, and a dry etching temperature being between 30° C. and 90° C.

7. The method for manufacturing the memory according to claim 4, after the forming the first electrode layer on side walls and bottom walls of the capacitor holes, the method for manufacturing further comprising:

forming a second mask layer on the protective layer above the array region;

patterning the second mask layer to form a plurality of first openings spaced apart in the second mask layer, each of the first openings exposing at least one of a plurality of electrode support portions, and each of the first openings having a preset projection region on the substrate;

removing the third support layer in the electrode support portions that is exposed in the first openings to expose the second sacrificial layer; and removing the protective layer and the third support layer on the peripheral circuit region.

8. The method for manufacturing the memory according to claim 7, after the removing the third support layer in the electrode support portions that is exposed in the first openings, and removing the protective layer and the third support layer on the peripheral circuit region, the method for manufacturing further comprising:

removing the protective layer on the array region and the second sacrificial layer on the array region and the peripheral circuit region by wet etching.

9. The method for manufacturing the memory according to claim 8, wherein an etching solution used in the wet etching is a mixed solution of NH$_4$F and HF.

10. The method for manufacturing the memory according to claim 8, before the removing the protective layer on the array region and the second sacrificial layer on the array region and the peripheral circuit region by wet etching, and after the removing the third support layer in the electrode support portions that is exposed in the first openings, the method for manufacturing further comprising:

removing the second mask layer by dry etching.

11. The method for manufacturing the memory according to claim 10, wherein in the removing the second mask layer by dry etching, a gas for dry etching comprises at least one of Cl$_2$, SO$_2$, C$_4$F$_6$, CH$_2$F$_2$, O$_2$, CF$_4$, CHF$_3$ and SF$_6$.

12. The method for manufacturing the memory according to claim 10, after the removing the protective layer on the array region and the second sacrificial layer on the array region and the peripheral circuit region by wet etching, the method for manufacturing further comprising:

forming a third mask layer on the third support layer in the array region;

patterning the third mask layer to form a plurality of second openings arranged spaced apart in the third mask layer, a projection region of each of the second openings on the substrate coincides with the preset projection region;

removing the second support layer in the electrode support portions that is exposed in the second openings, to expose the first sacrificial layer; and removing the second support layer on the peripheral circuit region.

13. The method for manufacturing the memory according to claim 12, after the removing the second support layer in the electrode support portions that is exposed in the second openings, and removing the second support layer on the peripheral circuit region, the method for manufacturing further comprising:

removing the third mask layer; and removing the first sacrificial layer by wet etching.

14. The method for manufacturing the memory according to claim 12, wherein the second mask layer and the third mask layer each comprise a second hard mask layer and a photoresist layer stacked, and the second hard mask layer is arranged on the protective layer.

15. The method for manufacturing the memory according to claim 1, wherein the forming the first electrode layer on the side walls and the bottom walls of the capacitor holes, the top surface of the first electrode layer being flush with the top surface of the electrode support structure comprises:

forming a conductive layer on the side walls and the bottom walls of the capacitor holes and on a top surface of the protective layer; and removing the conductive layer on the top surface of the protective layer and part of the conductive layer on the side walls of the capacitor holes, the conductive layer remaining on the side walls and the bottom walls of the capacitor holes constituting the first electrode layer.

* * * * *